United States Patent [19]
Haberl et al.

[11] Patent Number: 5,801,376
[45] Date of Patent: Sep. 1, 1998

[54] PHOTOELECTRIC BARRIER AND METHOD FOR OPERATION

[75] Inventors: Paul Haberl, München; Werner Lehner, Gröbenzell; Hermann Haberer, München, all of Germany

[73] Assignee: Leuze lumiflex GmbH & Co., Munich, Germany

[21] Appl. No.: 822,639

[22] Filed: Mar. 21, 1997

[30] Foreign Application Priority Data

Mar. 21, 1996 [DE] Germany ............ 196 11 195.1

[51] Int. Cl.⁶ ........................................ G01V 9/04
[52] U.S. Cl. .................. 250/221; 250/559.4; 340/556
[58] Field of Search ................... 250/221, 222.2, 250/223 B, 559 H, 559 HH; 340/555–557

[56] References Cited

U.S. PATENT DOCUMENTS

| | | | |
|---|---|---|---|
| 4,266,124 | 5/1981 | Weber et al. | 250/221 |
| 5,130,532 | 7/1992 | Clemens | 250/221 |

FOREIGN PATENT DOCUMENTS

| | | |
|---|---|---|
| 0 345 361 | 12/1989 | European Pat. Off. . |
| 0 397 757 | 11/1990 | European Pat. Off. . |
| 31 19 876 | 12/1982 | Germany . |
| 36 05 885 | 8/1987 | Germany . |
| 38 03 033 | 8/1989 | Germany . |
| 39 39 191 | 5/1991 | Germany . |
| 42 24 784 | 2/1994 | Germany . |

*Primary Examiner*—Que Le
*Attorney, Agent, or Firm*—Senniger, Powers, Leavitt & Roedel

[57] ABSTRACT

A photoelectric barrier and operation thereof, the barrier having at least two pairs of transmitters/receivers each operating synchronously. Each of the two transmitters transmits a light signal having a specific identifier, the signal being in the form of a double pulse separated by a pause, which double pulse consists of two pulse groups each separated by a pause, and each receiver evaluates a light signal of the associated transmitter as correctly received when at least one of the two pulse groups is recognized as valid by means of the associated identifier, in which the duration of the pulse groups and the pauses between them are established so that at most one pulse group of one double pulse of the one transmitter is superimposed with one pulse group of one double pulse of the other transmitter.

23 Claims, 4 Drawing Sheets

TRANSMITTER

RECEIVER

PHOTOELECTRIC BARRIER AND METHOD FOR OPERATION

BACKGROUND

The invention pertains to a photoelectric barrier and a method for the operation of a photoelectric barrier, that is, for the operation of an optoelectronic machine guard, a light barrier, or light-beam curtain.

From DE 4,224,784 A1 it is known how to "blank out" spurious pulses from remote light sources so that the transmitter and receiver will be synchronized in such a way that within one time period which is less than the minimum interval of the usual spurious light pulses, a double pulse is transmitted and the receiver is only activated at the instant of the double pulses. Thus, at least one of the double pulses will fall within the pause in the spurious light and the receiver can evaluate it. This evaluation is thus designed so that only the reception of one pulse group of the double pulse is evaluated as sufficient.

Of course, this known method is well suited to eliminating spurious light pulses from foreign light sources, such as neon lighting tubes, electric arc welding equipment, etc. But it fails when several devices of the same type are set up in a room so that they can influence each other. Due to overreaching of one light transmitter, whether in direct transmission mode or due to reflection from objects, it can happen that one receiver will receive light from a transmitter not belonging to it. If one such "false" light pulse coincides with a useful pulse belonging to the corresponding receiver, then the receiver cannot properly evaluate the standard coded pulses and it will generate a fault signal. In safety monitoring equipment, this usually results in the shutting down of the monitored machine, so that the availability of the machine will be dramatically reduced when the monitoring equipment is set up in an adverse configuration. In an even worse case, a receiver can evaluate the signal originating from a foreign transmitter as "correct" and then output a signal for "guard field free" even though this field may be interrupted, for example, by a person. This is not acceptable for safety equipment for machinery.

The solution to this problem has two requirements, namely:

1. Each receiver must be able to distinguish light transmitted from its associated transmitter from light which was transmitted from other transmitters, and
2. Each receiver must not be disrupted by light from a foreign transmitter so that it does not properly evaluate the light transmitted from its associated transmitter.

One solution to this problem might be found by working with light having different wavelengths in each transmitter/receiver pair, which could be achieved by using appropriate color filters. Foreign light from another transmitter could not pass the color filter and thus it could not falsely simulate a "correct" reception or block the receiver for the light having the assigned wavelength. But the more that similar equipment is set up in one room, the narrower the required bandwidth of the color filters must be. This would mean not only an enormous expense, but would also require large transmission power. In addition, every transmitter/receiver pair would have to use individual color filters and care would have to be taken that two devices operating at the same wavelength are not set up in the same room, which then means a greater organizational effort and in addition, means that the equipment manufacturer and also the user will require a greater storage space, since most users keep several back-up devices in warehouses, so that production runs will not have to be interrupted for a long time upon failure of one monitoring device.

One alternative possibility could be to concentrate the light beams from transmitter to receiver so narrowly that foreign light emitted at a different angle will not arrive on the receiving diodes. In this manner, gradual improvements can be achieved, but then the structural expense for tuning efforts and beam concentration will be disproportionately large.

From DE 3,939,191 C2 it is known to transmit pulse-pause-modulated pulses with an identifier from multiple-beam one-way photoelectric barriers and thus to synchronize the receiver with the transmitter so that the particular receiving diodes will only be activated at predetermined points in time, at which the transmitter transmits the pulses. Thus, for each pair of transmitter diode and associated receiving diode, a time window will be opened synchronously, during which the signal transmission occurs. If these ideas are expanded to include several pairs of transmitters/receivers, then the problem of mutual interference can be solved since all pairs of transmitters/receivers are synchronized so that they are always transmitting alternately and thus the useful pulse of the one transmitter falls precisely within the pauses of all other transmitters. But this type of synchronization would have to be carried out by a centralized unit which is connected by cable to all other units. A synchronization by means of light pulses thus cannot be used, because the individual pairs of transmitters/receivers should inherently be set up so that they will not influence each other. Also, the light beam synchronizing all devices could be interrupted by persons, vehicles or other articles, so that this proposal must be excluded.

An improvement in the selectivity could take place according to the theory of DE 3,119,876 by superposition of several types of coding, for example, by using high-frequency, modulated light or a selective receiving circuit. But this method is only practical with a photoelectric barrier having from one to a small number of beams, since the transient recovery times of selective amplifiers would extend the cycle time of the photoelectric barriers. In addition, with this method, the transmitter must remain switched on modulated for a relatively long time, which leads to long cycle times and to a large power requirement.

Photoelectric barriers which transmit the pulse groups of coded light are also known from DE 3,803,033 A1, DE 3,605,885. Synchronization between light transmitter and light receiver is known from EP 0,397,757 B1, EP 0,345,361 A1 and U.S. Pat. No. 4,266,124.

SUMMARY OF THE INVENTION

It is the purpose of the present invention to overcome the above stated disadvantages and to propose a method by which the interference immunity of a photoelectric barrier, an optoelectronic machine guard or a light-beam curtain is improved with respect to the mutual influences due to other similar or structurally equivalent devices. This problem is solved by the features stated in claim 1. Favorable configurations and refinements of the invention are found in the dependent claims.

Briefly, therefore, the invention is directed to a method for noise-free operation of optoelectronic single or multi-beam photoelectric barriers with existing optical influence by a photoelectric barrier of the same or similar embodiment. Each transmitter transmits light beams in the form of double pulses consisting of two pulse groups. Each receiver evaluates the light beam of the associated transmitter as correctly received when at least one of the two pulse groups of one double pulse is recognized as valid. The duration of the pulse groups of the double pulses and the pauses between them are established so that at most one pulse group of a double pulse of one transmitter is superimposed by a pulse group of a double pulse of the other transmitters. Preferably, the pause between the two pulse groups of a double pulse of the one transmitter is greater than the duration of a pulse group. The pause between the two pulse groups of one double pulse of the other transmitter is greater than the pause between the two pulse groups of a double pulse of the first transmitter, plus two times the duration of one pulse group. The pause between two sequential double pulses of the one transmitter is greater than the pause between the two pulse groups of a double pulse of the other transmitter, plus two times the duration of one pulse group; finally, the pause between two sequential double pulses of the other transmitter is greater than the pause between the two pulse groups of a double pulse of the one transmitter, plus two times the duration of one pulse group.

The invention is also directed to a method for operating a photoelectric barrier that comprises at least two synchronously operating pairs of transmitters/receivers, wherein each of the two transmitters transmits a light signal having a specific identifier, the signal being in the form of a double pulse separated by a pause b and/or d. The double pulse consists of two pulse groups each separated by a pause a and/or c, respectively. Each receiver evaluates a light signal of the associated transmitter as correctly received when at least one of the two pulse groups is recognized as valid by means of the associated identifier, in which the duration p of the pulse groups and the pauses a and/or c between them are established so that at most one pulse group of one double pulse of the one transmitter is superimposed with one pulse group of one double pulse of the other transmitter.

The invention is further directed to a method for operating a photoelectric barrier device, and the device itself having two synchronously operating pairs of transmitters and receivers, namely, a first transmitter/receiver pair consisting of a first transmitter and a first receiver, and a second transmitter/receiver pair consisting of a second transmitter and a second receiver, wherein the first transmitter transmits a first light signal having a first specific identifier, and the second transmitter transmits a second light signal having a second specific identifier. The first light signal comprises a series of double pulses with each double pulse comprising two pulse groups each having a duration p and a pause between the two pulse groups having a duration a, and each double pulse is separated from the next double pulse by a pause having a duration b. The second light signal comprises a series of double pulses with each double pulse comprising two pulse groups each having a duration p and a pause between the two pulse groups having a duration c, and such that each double pulse is separated from the next double pulse by a pause having a duration d. A light signal received by the first receiver is designated as correctly received from the first transmitter when a) at least one of two sequentially received double pulses is recognized as valid by means of the first specific identifier, and b) the duration of the pulse groups received and of the pauses received are such that at most one pulse group of one double pulse of the first transmitter is superimposed with one pulse group of one double pulse of the second transmitter. A light signal received by the first receiver is designated as correctly received from the second transmitter when a) at least one of two sequentially received pulse groups is recognized as valid by means of the second specific identifier, and b) the duration of the pulses and of the pauses are such that at most one pulse of one pulse group of the second transmitter is superimposed with one pulse of one pulse group of the first transmitter.

Other objects and features of the invention will be in part apparent and in part pointed out hereinafter.

DETAILED DESCRIPTION OF THE INVENTION

The principal solution for the present invention is that the duration of the pulse groups and the pauses between them are designed for the particular pairs of transmitter/receiver so that one of the pulse groups of a double pulse of one transmitter reliably falls entirely within a pause of the other transmitter and/or of the other transmitters, respectively. The various transmitters need not be synchronized in this case, and can be clocked by free-running oscillators. Even if the oscillator frequencies of the various transmitters differ and the oscillators therefore do not oscillate precisely in phase with each other, nonetheless, with the invention it will be assured that at least one pulse group of a double pulse falls entirely into one pause of the other transmitter and/or of the other transmitters, respectively. Therefore, the long-term stability of the oscillators is not decisive, but rather only their short-time behavior within one period of the double pulse. Even relatively imprecisely operating oscillators operate with sufficient stability in short time intervals of only a few microseconds or milliseconds, so that the conditions for the length of the pulse groups and the pauses can be easily observed.

According to one embodiment of the invention, the time periods of the pulse groups and the pauses between them are established so that they satisfy the following conditions:

| | |
|---|---|
| $a > p$ | 1. |
| $c > a + 2p$ | 2. |
| $b > c + 2p$ | 3. |
| $d > a + 2p$. | 4. | where
- a=pause between the two pulse groups of one double pulse of one transmitter
- b=pause between the two pulse groups of one double pulse of the other transmitter
- p=duration of the pulse groups
- c=pause between sequential double pulses of the one transmitter and
- d=pause between sequential double pulses of the other transmitter.

If these four conditions are satisfied, then even in fully asynchronous operation of two transmitters it will always be assured that at least one pulse group of a transmitter falls entirely into one pause of the other transmitter.

According to one refinement of the invention, the time duration of the pulse groups and the pauses for each transmitter/receiver pair are adjustable and/or programmable by the user, so that upon subsequent set up of an additional transmitter/receiver pair, the corresponding time periods can be adapted to the devices already present.

According to one refinement of the invention, each pulse group of one transmitter has an identifier which differs from the identifiers of all other devices (channel identifier). According to another refinement of the invention, the two pulse groups of one double pulse have an additional identifier which indicates whether it pertains to the first or the second pulse group of the double pulse.

According to another refinement of the invention, in multiple beam photoelectric barriers, the pulse groups of one selected double pulse, preferably that of the first double pulse in the cycle, have an additional identifier which makes it possible to distinguish the corresponding light beam from all other light beams of the same transmitter. This identifier is used for synchronization between transmitter and associated receiver.

According to one additional embodiment of the invention, all pulse groups have an additional start bit.

According to another embodiment of the invention, in multiple beam photoelectric barriers, the double pulses can follow one another cyclically without any special pause at the end of a cycle.

In order to further increase the interference immunity, according to another embodiment of the invention, a multiple evaluation is provided in such a manner that an operation under fault conditions is only signaled when several sequential double pulses are not correctly recognized. Otherwise, it might happen that due to additional interference light sources precisely at that moment when a correct pulse group could be received, the receiver is disrupted by the interference light. Of course, the multiple evaluation must be concluded within such time that the response time of the entire system, including shut down of the monitored machinery, will still be observed.

According to one preferred refinement of the invention, during this multiple evaluation a variable threshold value is used which specifies how many fault states may appear in uninterrupted or interrupted sequence before a beam interrupt is signaled and possibly a monitored machine is shut down. This threshold value in the case of multiple beam photoelectric barriers depends on the number of beams and also on the above-mentioned response time of the system. This threshold value is entirely variable, so that it takes into account the history, and in the case of long-term, absolutely faultfree operation, it allows a greater number of fault states than for previous operation under fault conditions.

According to one refinement of the invention, this is effected in that a counter is incremented for each "correctly" recognized pulse group and decremented for each incorrectly recognized pulse group. The incrementing takes place up to a permanently specified maximum value which takes into account the response time of the system and the number of beams and/or the cycle time. If the counter contents are decremented to a predetermined value, for example, to zero, then a beam interrupt is assumed.

According to another refinement of the invention, a channel or device number can be programmed on the transmitter and receiver, through which at the same time at least the channel identifier and the time length of the pauses between individual pulse groups are specified. For each associated pair of transmitter and receiver, the user need only input the same channel or device number, which can take place, for example, by means of a dip switch, connector (a so-called jumper), a coded card, an external coding device or a coded plug. Thus, the user should pay attention that the same channel or device number is not issued twice within one room. Thus, all transmitters and receivers can have absolutely the same structure, which greatly reduces the production and storage expense. Likewise, the user can replace a defective component, such as a transmitter or a receiver, without great expense and need only program the other components.

According to another refinement of the invention, during the initial set-up of each receiver, a free channel is automatically sought, wherein during this time its associated transmitters are still switched off. If the receiver has found a free channel, then it will report this along a transmission path running from the receiver to the transmitter and the associated transmitter/receiver pair will synchronize to this channel.

In order to prevent the transmitter from synchronizing to a "false" channel, each associated transmitter/receiver-pair is to have an individual device number. This device number is exchanged between transmitter and receiver, for example, electrically with a cable, optically with light beams or by radio. This device number is, in turn, programmable by using the method described above.

A first transmitter sends along a channel 1 (FIG. 1) pulse groups 1A, 1B with time length p, wherein between these two a pause of duration a is present which is longer than the time p. The two pulse groups 1A and 1B together form a double pulse L11. After the end of the second pulse group 1B there is a pause b, whereupon an additional double pulse L12 with the two pulse groups 2A and 2B follows, which, in turn, have the same time period p and the same pause of length a between them. The pulse groups 1A, 1B differ from the pulse groups 2A, 2B due to an identifier. In the case of multiple beam photoelectric barriers, preferably the first light beam in the cycle has the corresponding identifier which denotes it as the first light beam, whereas all other, subsequent light beams have the same identifier as the second light beam.

Figure 1:
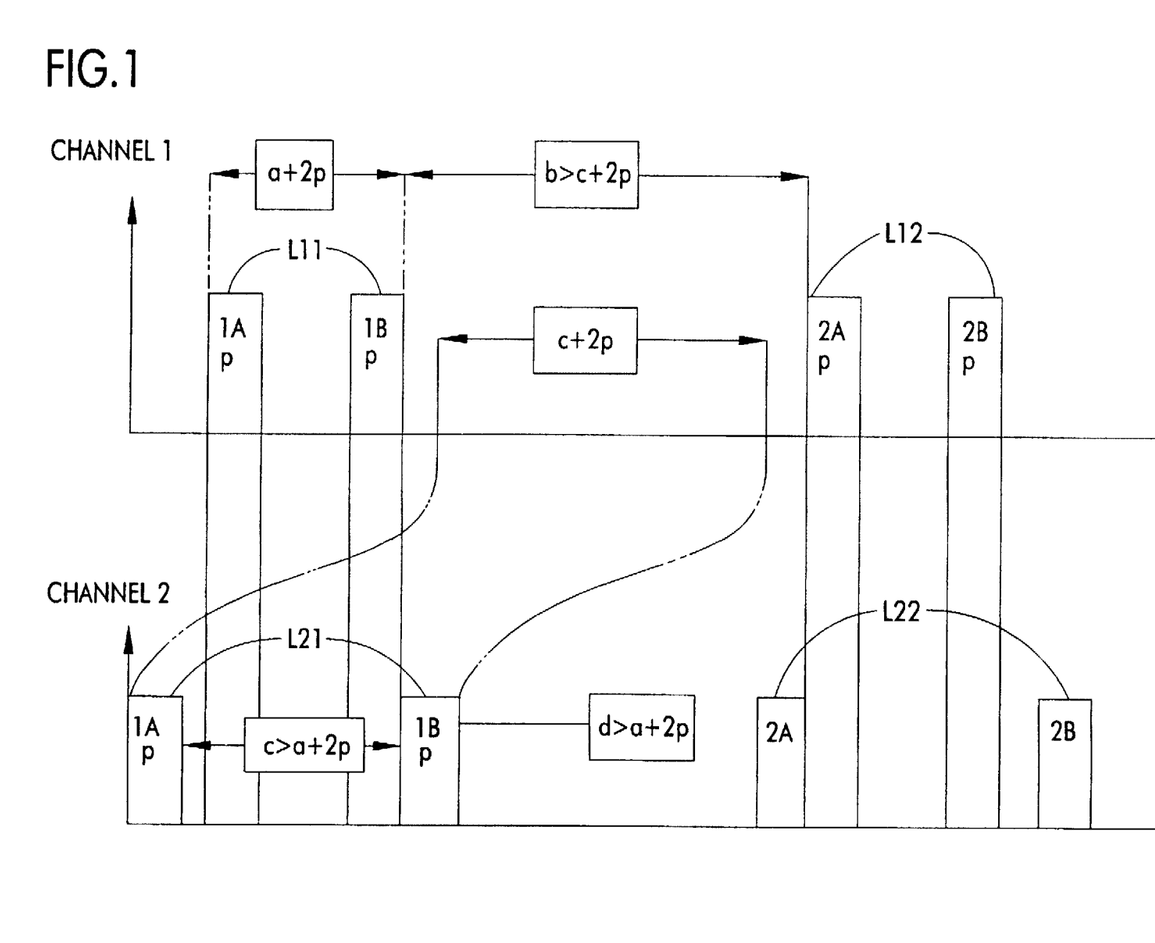
FIG. 1, a timing diagram of two double pulses for two channels.

A second transmitter transmits analogously on channel 2, wherein the individual pulse groups likewise have the same time period p as the pulse groups of the channel 1. The spacing between two pulse groups 1A and 1B of a first double pulse L21 amounts to c, wherein c is greater than the duration of the double pulse of channel 1, that is, greater than a+2p. The pause between sequential double pulses L21 and L22 is d, which is likewise greater than the duration of a double pulse of channel 1. Therefore, d>a+2p.

Finally, the time b between two double pulses of the channel 1 should, in turn, be selected greater than the time of a double pulse of the channel 2. Therefore b>c+2p. Also in the second channel, the identifier of the first beam is different from that of the other beams. In addition, the identifiers of the pulse groups of the channel 1 are different from those of the channel 2, so that each receiver can unambiguously determine whether the received light originates from its associated channel or a foreign channel.

From FIG. 1 it is quite clear that the double pulse L11 fits into the pause between the pulse groups 1A and 1B of the double pulse L21. In addition, it is evident that the double pulse L21 fits into the pause between the double pulses L11 and L12 of the channel 1. In the case of two channels, in order to ensure that at least one pulse group of a double pulse of a channel will fit entirely into one pause of the other channel, the following four conditions must be satisfied:

$a>p$     1.

$c>a+2p$     2.

$$b > c + 2p \quad 3.$$

$$d > a + 2p. \quad 4.$$

Figure 2A:
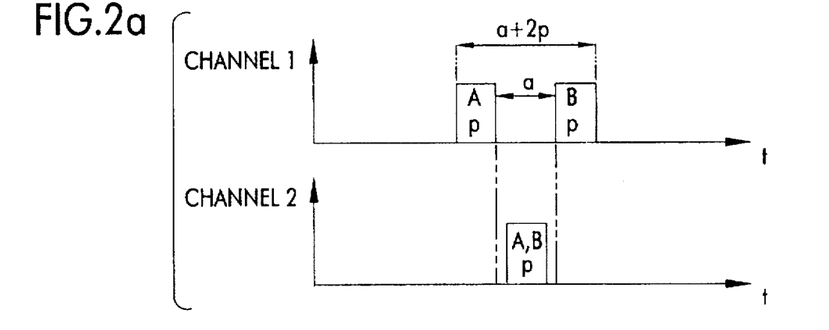
FIG. 2a to 2d, additional timing diagrams to illustrate the time conditions according to the method of the invention.

These four conditions will be illustrated once again with respect to FIGS. 2a to 2d. Condition 1 will ensure that a pulse group of channel 2 does not partly overlap both pulse groups of channel 1 (FIG. 2a).

Figure 2B:
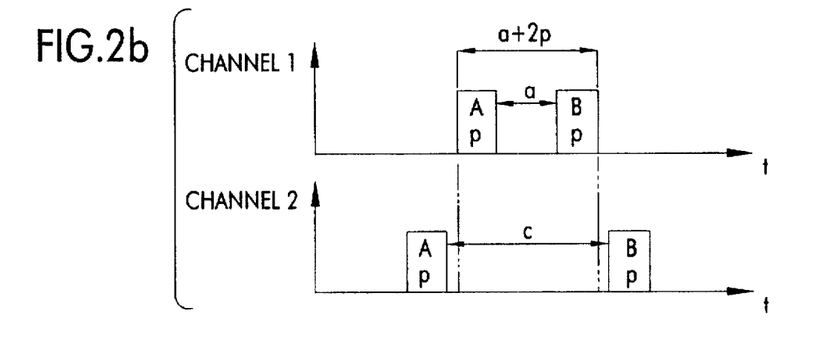

The second condition c>a+2p will ensure that the first pulse group of channel 1 does not simultaneously overlap the first pulse group of channel 2 and the second pulse group of channel 1 does not overlap the second pulse group of channel 2 (FIG. 2b).

Figure 2C:
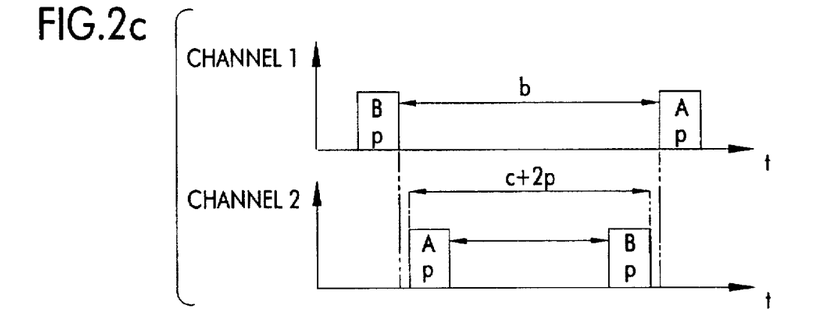

The third condition b>c+2p ensures that the second pulse group of a double pulse of the first channel will not simultaneously overlap, in a corresponding manner, the first pulse group of a double pulse of the second channel, and the first pulse group of a subsequent double pulse of the first channel does not overlap the second pulse group of a double pulse of the second channel (FIG. 2c).

Figure 2D:
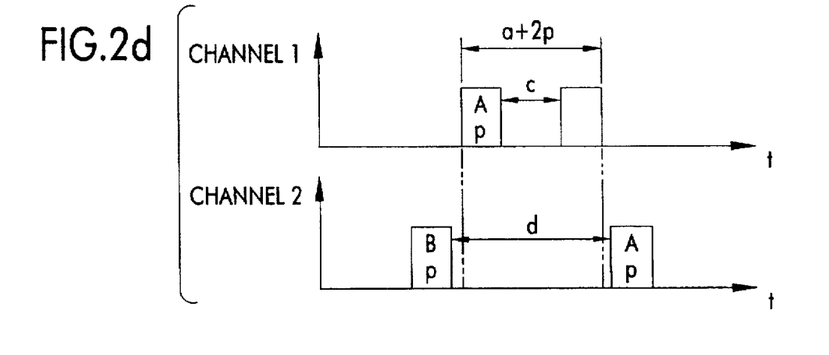

Finally, the fourth condition d>a+2p will ensure that the two pulse groups of a double pulse of the first channel will not overlap the second pulse group of a double pulse of the second channel and of the first pulse group of a subsequent double pulse of the second channel.

Thus, when these four conditions are satisfied, in every case it will be assured that at least one pulse group of a double pulse of one channel will fall entirely within a pause between the pulse groups of the second channel.

All time periods are dependent only on the quantities p and a, wherein p is selected preferably of equal length for all channels. Also, the pauses a, b, c and d do not vary during operation. However, they can be previously adjusted for each transmitter/receiver pair before beginning operation. The individual time values should be preadjusted so that a double pulse of the associated transmitter can be completely received at least once within the response time of the system of each channel. The response time of the system in this case, is the time between the arrival of a particular state, such as the occurrence of a beam interrupt and conclusion of the associated activities, such as shut down of a machine.

If more than two pairs of transmitters/receivers are operated simultaneously in one room, then the conditions stated above apply analogously, that is, the same condition applies with respect to channel 2 and channel 3, as between channel 1 and channel 2.

Figure 3:
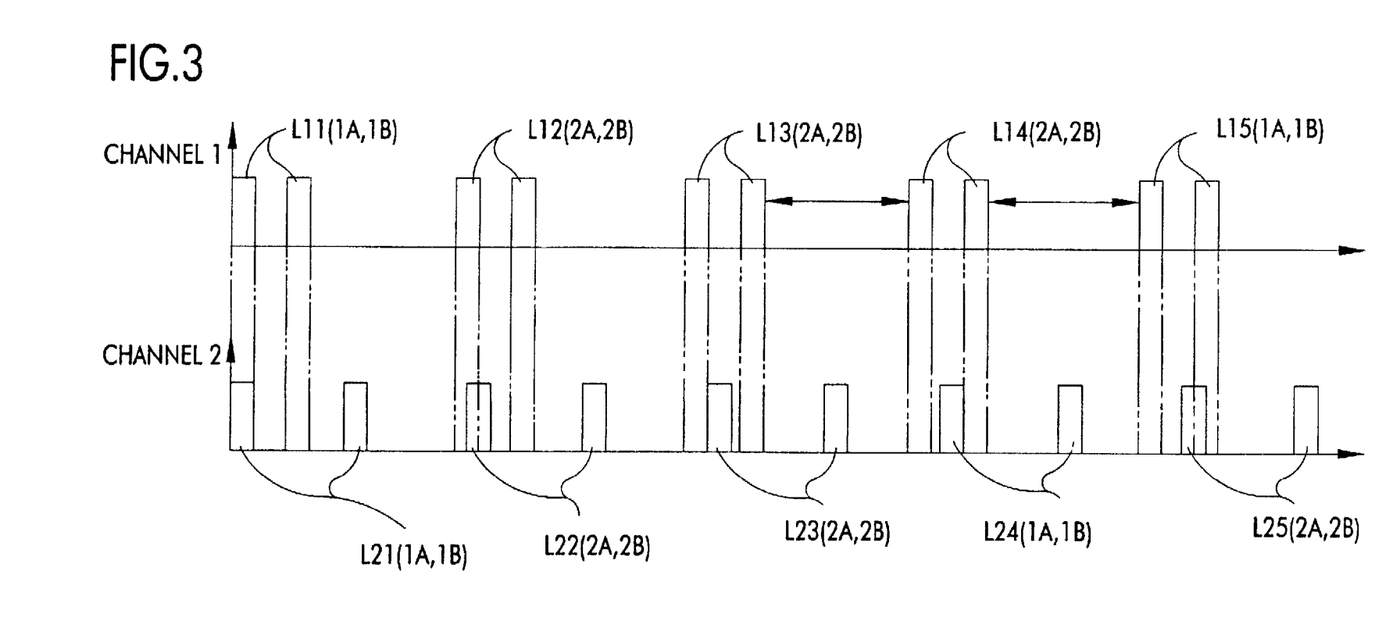
FIG. 3, additional timing diagrams of the double pulse for two channels shown over a longer time period.

FIG. 3 shows the time history of double pulses L11 to L15 in channel 1 and L21 to L25 in channel 2. The pulse groups from which the double pulses are composed are presented in parentheses after the reference symbol for the double pulses. The first pulse group 1A of the double pulses L11 and L12 begin synchronously in this case, that is, the two pulse groups completely overlap. The second pulse groups 1B of the double pulse L11 and L21 are entirely free of overlap. With regard to the second double pulse L12 or L22, the first pulse groups 2A and 2B still partly overlap, whereas here, too, the second pulse groups of this double pulse are free of overlap. In the third and fourth double pulses L13, L23; L14, L24 no overlap of any kind takes place. For the fifth double pulses the second pulse group of the double pulse L15 overlaps the first pulse group 2A of the double pulse L25. But in no case do the two pulse groups of one double pulse overlap pulse groups of the other channel.

To further improve the interference immunity, a multiple evaluation can be carried out beam by beam over several transmission cycles. This multiple evaluation shall be undertaken such that the correct reception of one pulse group of a beam increments a counter and an incorrect reception decrements the counter. A fault signal and/or a signal for an interrupted light beam will only be output when the contents of the particular counter falls below a specified value. Thus, this fault signal will only be output when—depending on the history—no correct light reception occurred in several preceding cycles. Incrementing of the counter takes place only up to a specified limit value which is specifically suited to the response time of the system and in the case of multiple beam photoelectric barriers, is specifically suited to the number of beams. For example, if the limit value is specified at 10, which represents a purely arbitrary number, then the content of the counter are incremented only up to a value of 10 and will remain with these numerical contents, even when additional "correct" pulse groups are received. For each incorrectly received pulse group, the numerical contents will be decremented by 1. If the response threshold is at numerical contents 0, then no later than after ten cycles, a fault signal will be output, when a fault occurs after ten sequential cycles. Therefore, the response threshold for all fault messages is variable and depends on the "pre-event history." For example, in initially undisturbed operation (numerical contents=10), if nine sequential pulse groups contain noise, then the tenth noisy pulse group will trigger the fault message. Every satisfactorily received pulse group then increases the response threshold again. By this method the interference immunity will increase, in particular with regard to spurious light from foreign light sources, such as stroboscopic lamps, igniting neon tubes, electric arc welding equipment, etc., which can just fall within the time period in which a pulse group must be received satisfactorily without influence by other photoelectric barriers. Thus, the response time will indeed be increased, but at the same time, the availability as well. According to another refinement of the invention it is also possible to select the steps for incrementing and decrementing the counter differently. For example, every correctly received pulse can increment the counter by the value 1, whereas every noisy, that is, not properly received pulse group will decrement the counter by a greater value, for example, 2. Thus, the availability will be somewhat less, but the response time of the system will be reduced.

Figure 4:
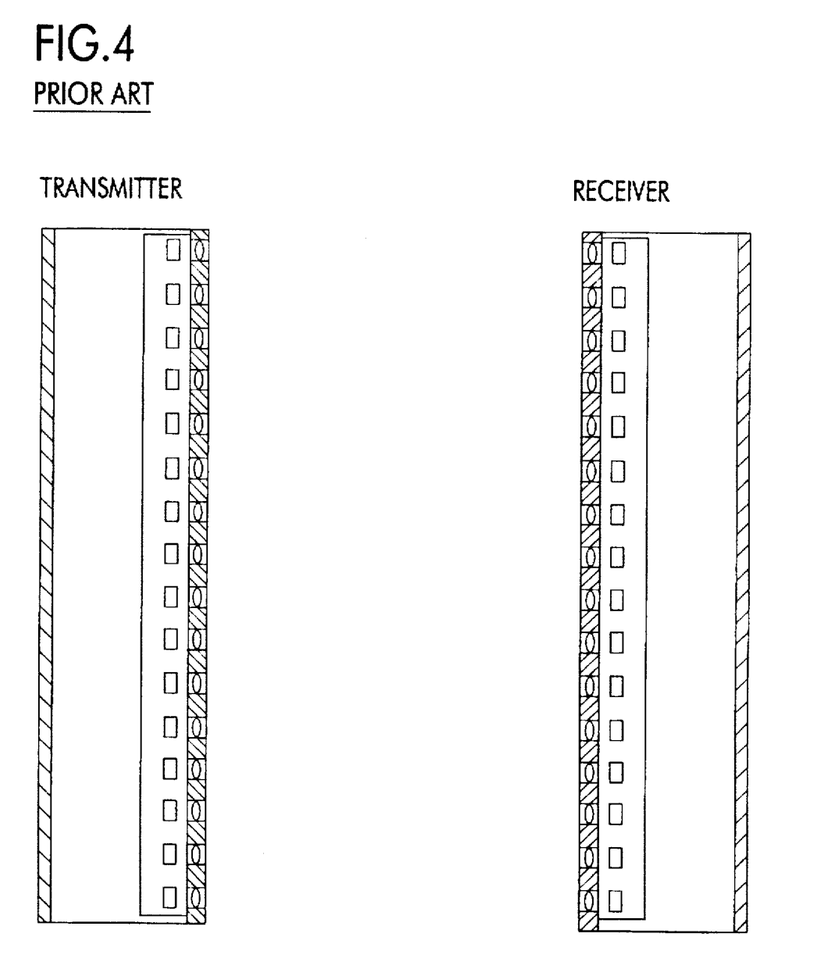
FIG. 4, a prior art photoelectric barrier.

It can be seen, therefore, that by incorporation of the foregoing features into a photoelectric device such as that shown in FIG. 4, the advantages described herein are achieved. For noise-free operation of optoelectronic single or multi-beam photoelectric barriers with existing optical influence by a photoelectric barrier of the same or similar embodiment, each transmitter transmits light beams in the form of double pulses consisting of two pulse groups. Each receiver evaluates the light beam of the associated transmitter as correctly received when at least one of the two pulse groups of one double pulse is recognized as valid. The duration of the pulse groups of the double pulses and the pauses between them are established so that at most one pulse group of a double pulse of one transmitter is superimposed by a pulse group of a double pulse of the other transmitter. Preferably, the pause between the two pulse groups of a double pulse of the one transmitter is greater than the duration of a pulse group; the pause between the two pulse groups of one double pulse of the other transmitter is greater than the pause between the two pulse groups of a double pulse of the first transmitter, plus two times the duration of one pulse group the pause between two sequential double pulses of the one transmitter is greater than the pause between the two pulse groups of a double pulse of the other transmitter, plus two times the duration of one pulse group; finally, the pause between two sequential double pulses of the other transmitter is greater than the pause between the two pulse groups of a double pulse of the one transmitter, plus two times the duration of one pulse group.

As various changes could be made in the above constructions without departing from the scope of the invention, it is intended that all matter contained in the above description and shown in the accompanying drawings shall be interpreted as illustrative and not in a limiting sense.

What is claimed is:

1. A method for operation of a photoelectric barrier that comprises at least two pairs of transmitters/receivers each operating synchronously, wherein each of the two transmitters transmits a light signal having a specific identifier, said signal being in the form of a double pulse separated by a pause b and/or d, said double pulse consisting of two pulse groups each separated by a pause a and/or c, respectively, and each receiver receiver and evaluates a light signal of the associated transmitter as correctly received when at least one of the two pulse groups is recognized as valid by means of the associated identifier, in which the duration p of the pulse groups and the pauses a and/or c between them are established so that at most one pulse group of one double pulse of the one transmitter is superimposed with one pulse group of one double pulse of the other transmitter.

2. The method according to claim 1 wherein the following relations apply for the period p of the pulse groups and the pauses a, b, c, d,:

$a > p$ $c > a + 2p$ $b > c + 2p$ $d > a + 2p.$

3. The method according to claim 2 wherein the period p of the pulse groups and the pauses a, b, c, d, between the pulse groups are adjustable for each transmitter/receiver pair.

4. The method according to one of claim 3 wherein the pulse groups are coded with an identifier which is different for each transmitter/receiver pair.

5. The method according to claim 4 wherein the two pulse groups of each double pulse are coded with an identifier which indicates whether it pertains to the first or second pulse group of the particular double pulse.

6. The method according to claim 5 wherein each transmitter transmits its double pulse groups cyclically.

7. The method according to claim 5 wherein in the case of multi-beam, cyclically operating lightbeam barriers as optoelectronic machine guards, the pulse groups of the first double pulse in the cycle have an identifier different from all other pulse groups of the additional double pulses of the transmitter/receiver pair.

8. The method according to claim 7 wherein the pulse groups for each light signal of each transmitter are evaluated for several sequential cycles and a fault signal is then generated when a predetermined number of fault states occurs in a predetermined number of sequential cycles.

9. The method according to claim 8 wherein the specified number of evaluated cycles and the specified number of fault states after which a fault signal is generated, can be made dependent on the number of pulse groups correctly received beforehand on the number of pulse groups not correctly received beforehand on the number of light signals on the reaction time of the transmitter/receiver pair, and on a machine monitored by it.

10. The method according to claim 9 wherein a multiple evaluation takes place in that each "correctly" received double pulse increments a counter up to a previously specified maximum value and each "incorrectly" received double pulse decrements the counter, wherein a fault signal is triggered when the counter is decremented below a specified threshold value.

11. The method according to claim 10 wherein the incrementing and decrementing of the counter takes place in different steps.

12. The method according to claim 11 wherein each transmitter/receiver pair contains a programmable device number through which the duration of the pulse groups and the duration of the pauses between them are specified.

13. The method according to claim 12 wherein each receiver upon initial operation carries out an automatic channel search for a free channel, subsequently passes information about a free channel to its associated transmitter, and subsequently synchronizes the associated transmitter/receiver pair to this free channel, wherein the transmitter/receiver pair uses a handshake operation to identify each other.

14. A method for operation of a photoelectric barrier that comprises two pairs of transmitters/receivers each operating synchronously, namely, a first transmitter/receiver pair consisting of a first transmitter and a first receiver, and a second transmitter/receiver pair consisting of a second transmitter and a second receiver, wherein the first transmitter transmits a first light signal having a first specific identifier, and the second transmitter transmits a second light signal having a second specific identifier; the method comprising, generating said first light signal such that it comprises a series of double pulses with each double pulse comprising two pulse groups each having a duration p and a pause between the two pulse groups having a duration a, and such that each double pulse is separated from the next double pulse by a pause having a duration b, generating said second light signal such that it comprises a series of double pulses with each double pulse comprising two pulse groups each having a duration p and a pause between the two pulse groups having a duration c, and such that each double pulse is separated from the next double pulse by a pause having a duration d, designating a light signal received by the first receiver as correctly received from the first transmitter when a) at least one of two sequentially received double pulses is recognized as valid by means of the first specific identifier, and b) the duration of the pulse groups received and of the pauses received are such that at most one pulse group of one double pulse of the first transmitter is superimposed with one pulse group of one double pulse of the second transmitter; and designating a light signal received by the first receiver as correctly received from the second transmitter when a) at least one of two sequentially received pulse groups is recognized as valid by means of the second specific identifier, and b) the duration of the pulses and of the pauses are such that at most one pulse of one pulse group of the second transmitter is superimposed with one pulse of one pulse group of the first transmitter.

15. The method according to claim 14 wherein the following relations apply for the period p of the pulse groups and the pauses a, b, c and d:

$a > p$ $c > a + 2p$ $b > c + 2p$ $d > a + 2p.$

16. The method according to claim 15 wherein the period p of the pulse groups and the pauses a, b, c, d, between the pulse groups are adjustable for each transmitter/receiver pair.

17. The method according to claim 14 wherein each transmitter transmits its double pulse groups cyclically.

18. The method according to claim 14 wherein in the case of multi-beam, cyclically operating lightbeam barriers as optoelectronic machine guards, the pulse groups of the first double pulse in the cycle have an identifier different from all other pulse groups of the additional double pulses of the transmitter/receiver pair.

19. The method according to claim 14 wherein the pulse groups for each light signal of each transmitter are evaluated for several sequential cycles and a fault signal is then generated when a predetermined number of fault states occurs in a predetermined number of sequential cycles.

20. The method according to claim 19 wherein the specified number of evaluated cycles and the specified number of fault states after which a fault signal is generated, can be made dependent on the number of pulse groups correctly received beforehand on the number of pulse groups not correctly received beforehand on the number of light signals on the reaction time of the transmitter/receiver pair, and on a machine monitored by it.

21. The method according to claim 20 wherein a multiple evaluation takes place in that each "correctly" received double pulse increments a counter up to a previously specified maximum value and each "incorrectly" received double pulse decrements the counter, wherein a fault signal is triggered when the counter is decremented below a specified threshold value.

22. The method according to claim 14 wherein each receiver upon initial operation carries out an automatic channel search for a free channel, subsequently passes information about a free channel to its associated transmitter, and subsequently synchronizes the associated transmitter/receiver pair to this free channel, wherein the transmitter/receiver pair uses a handshake operation to identify each other.

23. A photoelectric barrier comprising:

two pairs of transmitters/receivers each operating synchronously, namely, a first transmitter/receiver pair consisting of a first transmitter and a first recevier, and a second transmitter/receiver pair consisting of a second transmitter and a second receiver, wherein the first transmitter transmits a first light signal having a first specific identifier, and the second transmitter transmits a second light signal having a second specific identifier, wherein the first light signal comprises a series of double pulses with each double pulse comprising two pulse groups each having a duration p and a pause between the two pulse groups having a duration a, and each double pulse is separated from the next double pulse by a pause having a duration b, wherein the second light signal comprises a series of double pulses with each double pulse comprising two pulse groups each having a duration p and a pause between the two pulse groups having a duration c, and such that each double pulse is separated from the next double pulse by a pause having a duration d, wherein a light signal received by the first receiver is designated as correctly received from the first transmitter when a) at least one of two sequentially received double pulses is recognized as valid by means of the first specific identifier, and b) the duration of the pulse groups received and of the pauses received are such that at most one pulse group of one double pulse of the first transmitter is superimposed with one pulse group of one double pulse of the second transmitter, and wherein a light signal received by the first receiver is designated as correctly received from the second transmitter when a) at least one of two sequentially received pulse groups is recognized as valid by means of the second specific identifier, and b) the duration of the pulses and of the pauses are such that at most one pulse of one pulse group of the second transmitter is superimposed with one pulse of one pulse group of the first transmitter.

* * * * *